RESONANCE FREQUENCY CONTROL

Filed June 8, 1953 2 Sheets-Sheet 1

INVENTOR.
LOWELL E. NORTON

BY Milton S. Winters
ATTORNEY

RESONANCE FREQUENCY CONTROL

Filed June 8, 1953 2 Sheets-Sheet 2

INVENTOR.
LOWELL E. NORTON

BY Milton S. Winters
ATTORNEY 2,747,088

RESONANCE FREQUENCY CONTROL

Lowell E. Norton, Princeton, N. J., assignor to Radio Corporation of America, a corporation of Delaware Application June 8, 1953, Serial No. 360,296

22 Claims. (Cl. 250—36)

The present invention is related to frequency control, and particularly to frequency control by means of resonance.

It is known that gases at low pressures exhibit resonance to microwave energy at certain frequencies. The resonant absorption of gas has been employed heretofore for frequency control. The present invention affords an improvement over prior systems. The prior systems are in general difficult to build, and require comparatively expensive components. Some of the prior systems, although simple, do not afford adequate certainty of operation. The system is also operable with other high Q resonant elements affording an exaggerated shift of phase with frequency.

It is an object of the present invention to provide a novel and improved simple system of frequency control.

Another object of the present invention is to provide a novel simple frequency stabilization system.

A further object of the invention is to provide a novel and simple system of frequency control having certainty of operation, ease of maintenance, and employing for the major part of its components standard readily available parts, and to provide such a system especially suitable for gas cell frequency control.

In accordance with the invention energy from the microwave oscillator to be frequency controlled, is applied to a resonant element, for example, a gas absorption cell. Also, the microwave oscillator energy as carrier energy is modulated by energy from a modulation oscillator, and the carrier frequency component suppressed. The oscillator energy after passage through the cell is employed as a carrier supplied to the side-band energy for detection after the fashion of side-band detection, except that the carrier energy is phase shifted due to differential path travel by a quarter wavelength or odd multiple thereof. The phase of the frequency component thus detected is compared with the reference phase from the modulating oscillator to provide a correction or frequency control voltage which is applied to the microwave oscillator to control the frequency thereof. As will appear more fully hereinafter, the exaggerated phase shift of the microwave oscillator energy near a resonance frequency of the resonant element causes the correction or frequency control voltage to have a rapid rate of change for oscillator frequencies departing from the resonance frequency. Thus, in particular where a gas cell is employed, due to the anomalous dispersion characteristic of the gas in the cell, which gives rise to this exaggerated phase shift, the microwave oscillator frequency is closely controlled. No amplifier at the microwave frequency need be employed. Even though there is a change in the frequency of the modulation oscillator, the control of the microwave oscillator at the desired resonance point remains unaffected. The system has special advantages where a gas cell is employed because the component passing through the gas cell without phase shift, does not contribute to the frequency control output.

The foregoing and other objects, advantages, and novel features of the invention will be more fully apparent from the following description when read in connection with the accompanying drawing in which like reference numerals refer to similar parts and in which.

Figure 1:
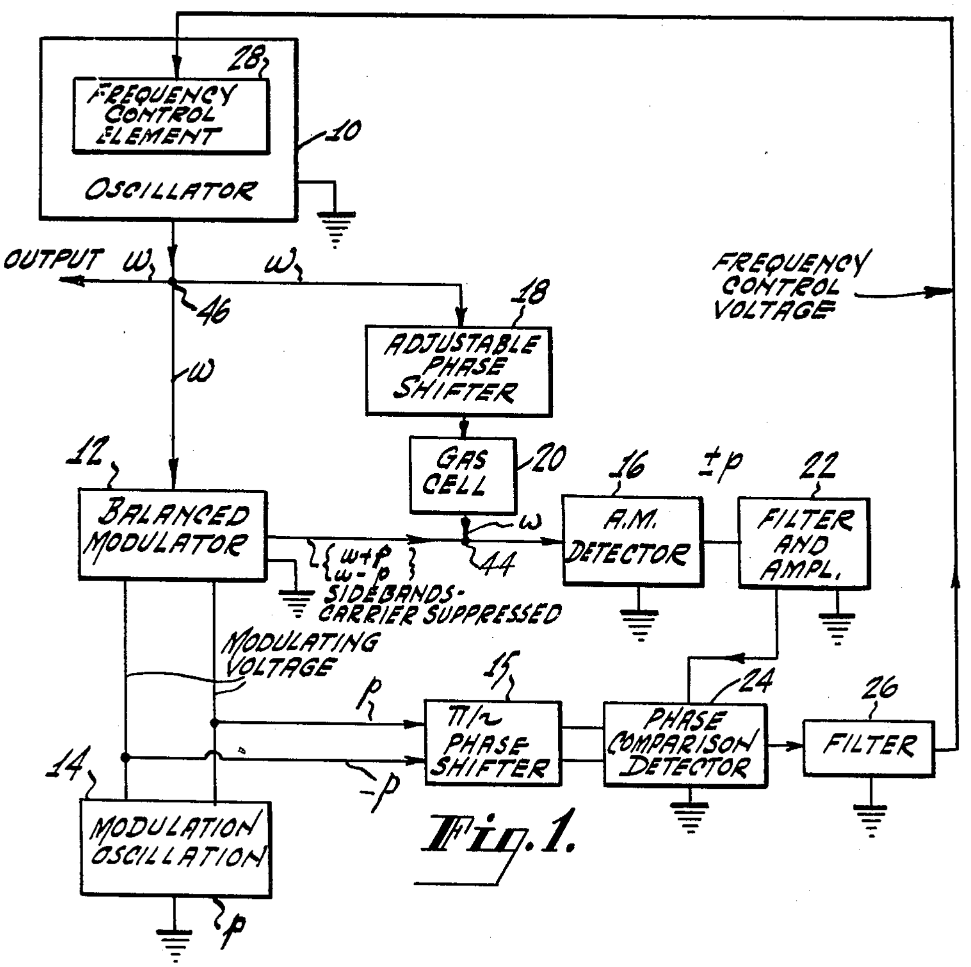
Fig. 1 is a diagram, in block schematic form, illustrating one embodiment of the invention.

Referring to Fig. 1, a microwave oscillator is connected to apply energy to a balanced modulator 12. A modulation oscillator 14 applies modulation frequency energy to the modulator 12. The output from the modulator 12, having side-band components and suppressed carrier frequency, is connected to an A. M. (amplitude modulation) detector 16. The microwave oscillator energy is connected by a second path including an adjustable phase shifter 18 and a gas cell 20 to the A. M. detector 16. The A. M. detector 16 output, at the modulation frequency, is filtered and amplified in filter and amplifier 22 and thence connected or coupled to a phase comparison detector 24, for comparison with signals from modulation oscillator 14 connected to the phase comparison detector 24 through a $\pi/2$ phase shifter 15. The output of the phase comparison detector after filtering in a filter 26 is applied as a frequency control voltage to a frequency control element 28 of the microwave oscillator 10.

In operation, let $\omega_0$ be the resonant frequency of the gas of gas cell 20, and suppose the microwave oscillator 10 to operate at frequency $\omega$ at or very near the frequency $\omega_0$. Let the frequency of the modulation oscillator be $p$. The balanced modulator 12 has the frequency $\omega$ applied as a carrier. Therefore, the balanced modulator 12 output includes the upper and lower side-band components at frequencies $(\omega+p)$, and $(\omega-p)$ (both $\omega$ and $p$ may be angular frequencies). In passing through the path including the gas cell 20 the frequency $\omega$ is phase shifted in an exaggerated manner due to the gas resonance.

Figure 2:
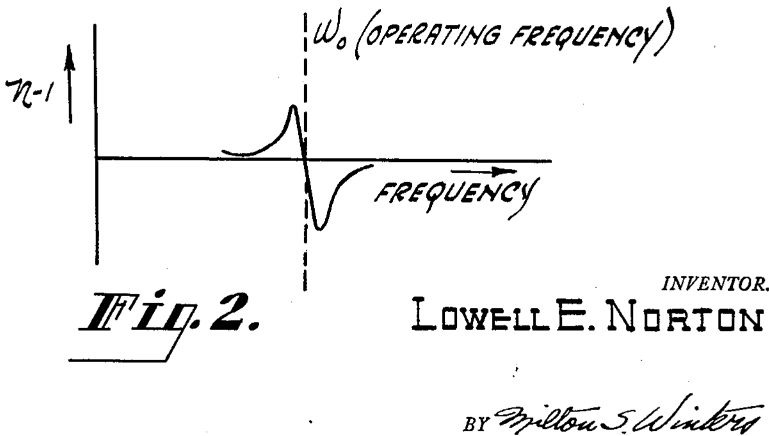
Fig. 2 is a curve illustrating a typical anomalous dispersion characteristic of a gas near a resonance point which curve is useful in explaining the operation of the arrangement of Fig. 1.

In passing through the gas, the field at frequency $\omega$ in the neighborhood of the resonant frequency $\omega_0$, displays an anomalous dispersion characteristic. At $\omega_0$, the field has a zero phase shift resultant from passage through the gas so far as the anomalous dispersion contribution is concerned. Thus in Fig. 2, the plot of $n$–1, where $n$ is the index of refraction, shows steep dispersion line on each side of $\omega_0$, which returns eventually in a typical anomalous dispersion characteristic, toward the reference line. This means that in the close vicinity of $\omega_0$, there is an exaggerated phase shift $\phi$ dependent on frequency, such as is associated with resonances of high Q.

Therefore, in Fig. 1, a field at frequency $\omega$ after passage through the gas of the absorption gas cell 20 acquires a phase shift $$\phi-\frac{\omega L_1}{\nu_1}$$

where $\phi$ is due to anomalous dispersion, and $$\frac{\omega L_1}{\nu_1}$$

represents the phase shift due to the electrical path length $L_1$ from microwave oscillator 10 through phase shifter 18 and gas cell 20, for a phase velocity $\nu_1$ at frequency $\omega$.

The side-band energy may be characterized as having phases $$\frac{(\omega+p)L_2}{v_2}$$

for phase velocity $v_2$ at frequency $(\omega+p)$ and $$\frac{(\omega-p)L_2}{v_3}$$

for phase velocity $v_3$ at frequency $(\omega-p)$, $(\omega+p)$ and $(\omega-p)$ having respective phase shifts dependent on the electrical path length $L_2$ from microwave oscillator 10 through balanced modulator 12 to A. M. detector 16. If the oscillator 10 output is $$e_1=E_1 \sin \omega t \quad (1)$$

and push-pull modulating oscillator 14 output is $$\begin{cases} e_2=E_2 \sin pt \\ e_2'=E_2 \sin pt \end{cases} \quad (2)$$

then a field $$c_3=kE_1E_2\left\{\cos\left[(\omega-p)t-\frac{(\omega-p)L_2}{v_3}\right]-\cos\left[(\omega+p)t-\frac{(\omega+p)L_2}{v_2}\right]\right\}+k_1E_1\cos\left(\omega t+\phi-\frac{\omega L_1}{v_1}\right) \quad (3)$$

is impressed on the A. M. detector 16.

It the transmission paths are coaxial waveguide then $$v_1=v_2=v_3=v \quad (4)$$

Also, if the transmission paths are hollow pipe waveguide, condition (4) can be approximated to any desired precision merely by operating far enough from the waveguide cut-off frequency. The filter of 22 does not pass carrier frequency components and hence, using the operating condition of (4), the output of 22 is $$e_4=k_2E_1^2E_2\left\{\cos\left[pt-\left(\frac{\omega L_1}{v}-\frac{\omega-p}{v}L_2\right)+\phi\right]-\cos\left[pt-\left(\frac{\omega+p}{v}L_2-\frac{\omega L_1}{v}\right)-\phi\right]\right\} \quad (5)$$

There will always be a residual standing wave in the transmission paths and this will lead to errors because one, or two of the three frequency components at $(\omega+p)$, $\omega$, and $(\omega-p)$ will always be accentuated at detector 16. These errors can be reduced to minor second order effects in the following way. The relation between path length $L_1$ and $L_2$ is selected so that detector 16 is at similar points of the standing wave (whatever it may be) for fields at frequency $(\omega+p)$, $\omega$, and $(\omega-p)$. This is done by choosing from (5)

$$\begin{cases} \frac{\omega L_1}{v}-\frac{\omega-p}{v}L_2=n\pi \\ \frac{\omega+p}{v}L_2-\frac{\omega L_1}{v}=n\pi \end{cases} \quad (6)$$

where $n$ is an integer. From (6), the desired path lengths are $$L_2=\frac{n\pi v}{p}=\frac{n\lambda p}{2} \quad (7)$$

where $\lambda p$ is the wavelength at the modulation frequency $p$, and $L_1=L_2$.

To avoid differential thermal changes in the two paths $L_1$ and $L_2$ it is desirable to solder or weld together the outer wall within which waves of the waveguides (hollow pipe or coaxial line) of the two paths are guided, so that they are in good thermal contact. Using the preferred line lengths of (7) in (5) the output of 22 is $$e_5=k_3E_1^2E_2 \sin \phi \sin pt \quad (8)$$

The output amplitude from 22 at frequency $p$ becomes zero where $\omega=\omega_0$ and the phase $\phi$ due to anomalous dispersion is zero. Also, the albegraic sign of sin $\phi$ changes as $\phi$ itself changes sign corresponding to a change in sense of direction of frequency drift of $\omega$ from $\omega_0$. The filter and amplifier 22 output is phase detected against reference phase at frequency $p$, obtained from modulating oscillator 14 through $\pi/2$ phase shifter 15. Alternatively, the proper phase shift could be achieved by using the proper length of line from 22 to the phase comparison detector 24. Preferably, the detector 24 operates with the two components of frequency $p$ in phase quadrature. In this way, by properly adjusting $\pi/2$ phase shifter 15, there is no D. C. (direct current) term to filter from the output of phase comparison detector 24 in filter 26, when the oscillator 10 is at operating frequency $\omega_0$. The non-ambiguous frequency control voltage obtained from filter 26 is substantially proportional to the plot of $n$–1 against frequency shown in Fig. 2. The output or frequency control voltage from filter 26 should be connected in the proper sense to return the microwave oscillator 10 to its proper frequency $\omega_0$ if it departs therefrom.

Such departure causes a comparatively large change in phase $\phi$ with frequency and the microwave oscillator is therefore closely controlled. If the sense of the frequency control voltage is not correct, it may be reversed, for example by reversing connections of the modulation oscillator to the phase comparison detector, or reversing suitable connections in the phase comparison detector 24. By making the paths as nearly equal as possible physically, and soldering or welding to insure good thermal contact, the changes in frequency due to the differential path lengths, may be made very small. Changes in ambient temperature then tend to compensate each other, as the difference in path lengths remains small and electrically negligible.

It might appear that an ordinary modulator could be employed, and no separate path used for the carrier frequency, here reinserted at the A. M. detector. However, note that there is a phase shift of 90° in reinsertion of the carrier. The carrier frequency component thus shifted does not contribute to the A. M. detector output. Only a small portion of the carrier is affected by the rapid phase shift with frequency caused by the gas. Much energy passes through the gas cell without being "resonated," and without its phase being affected by the gas. In the present system such component not shifted would contribute substantially zero to the A. M. detector 16 output. However, if an ordinary A. M. system were employed, without carrier suppression, the A. M. detector 16 output would contain a large output term frequency $p$ unaffected by gas anomalous dispersion phase shift. It may be noted however that the adjustable phase shifter 18 adjustment need not be perfect, because $\phi$ changes far more rapidly with change of frequency from $\omega_0$ than does a phase due to path length difference $L_1$–$L_2$. The frequency will therefore stabilize at a point extremely close to $\omega_0$, notwithstanding small misadjustment of phase shifter 18. Of course, the difference in path lengths may be appropriately pre-adjusted and the adjustable phase shifter 18 omitted. For more exact adjustment of the phase shifter 18, the output of microwave oscillator 10 may be applied to a second gas cell (not shown) like the gas cell 20 and having the same gas, and adjusting phase shifter 18 until the output $\omega$ is stabilized at $\omega_0$ as indicated by suitable test apparatus associated with the second gas cell.

The components illustrated are all known. The microwave energy may be conducted by hollow pipe or coaxial line waveguide, and the lower frequency component in any manner suitable to the frequencies involved. The modulation oscillator 14 frequency $p$ is preferably at least as great as the absorption spectrum line width of the gas cell. For example, if the gas of gas cell 20 is ammonia, and stabilization at the spectral 3, 3 line near 23,870 magacycles per second is contemplated, a suitable cell will provide a line of, for example, 70 kc. s. (kilocycles per second) width, as usually defined. The modulation oscillator 14 frequency $p$ should then be at least 70 or 100 kc. s., and better about 200 kc. s. For better signal to noise detection, the modulation oscillator 14 frequency may be 10 or 20 megacycles per second. It is advantageous that the modulation oscillator need not be stabilized, but may vary in frequency within wide limits.

Figure 3:
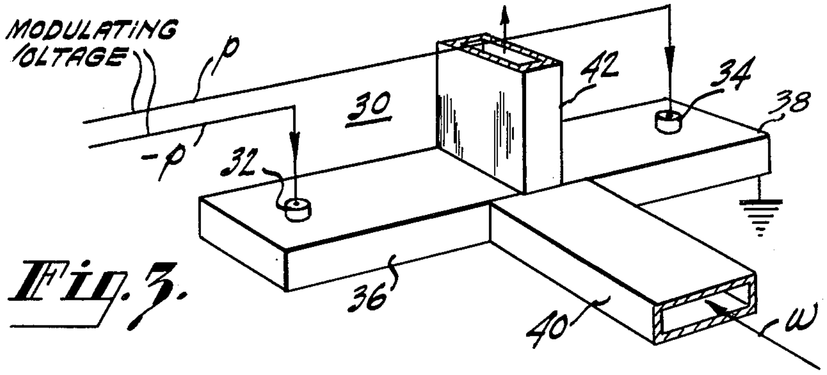
Fig. 3 is a perspective view of a balanced modulator suitable for use in the arrangement of Fig. 1.

The balanced modulator 12 may take the form of a magic "T" 30 as shown in Fig. 3. Crystals 32, 34 are respectively inserted in matched (at the frequency $\omega$) terminations of one pair of arms 36, 38. Energy at frequency $\omega$ is applied to one arm 40 of the other pair of arms and the output taken from the remaining arm 42. The arrangement of Fig. 3 is known.

Preferably the junction 44, which may be a hollow pipe waveguide junction, is such that energy from gas cell 20 and from modulator 12 flow toward or into detector 16 with little or no reflection. Junction 44 may be included in detector 16. The junction 46 at which microwave oscillator 10 energy is branched to two different paths is also preferably non-reflective. Such junctions are known. Suitable phase comparison detectors 24 are known. One which may be used is described as component 62A of Fig. 9 in patent application Serial No. 148,481, filed March 8, 1950. The manner of connection thereof with the other components will be understood by those skilled in the art from the description herein. The microwave oscillator 10 may be a klystron with a reflector, and the frequency control element 28 may be the reflector of the klystron. It may be noted that no amplifier at the microwave frequency $\omega$ is necessary in this arrangement.

Figure 4:
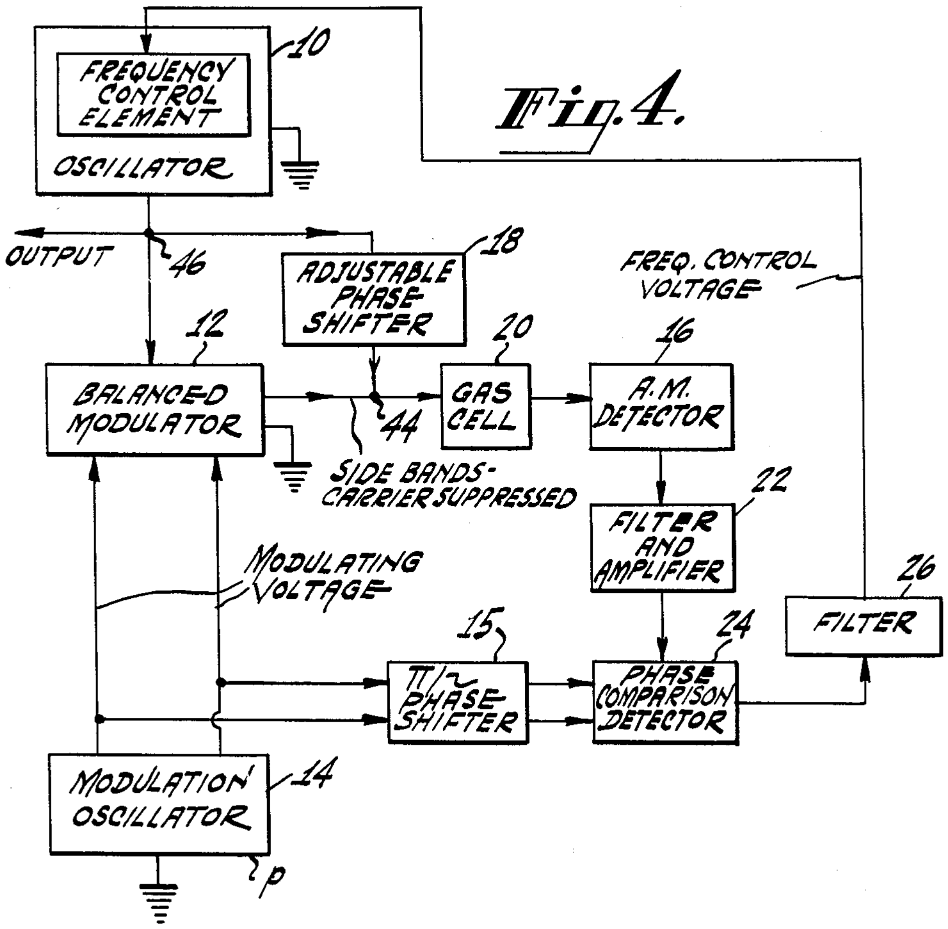
Fig. 4 is a diagram in block schematic form of another embodiment of the invention.

Referring to Fig. 4, a modification is made in that the energy path from the microwave oscillator 10 joins the path of the modulated side-band energy from the balanced modulator 12 after passing through the adjustable phase shifter 18 but before entering the gas cell 20. Thus from junction 44 the carrier suppressed microwave energy and the unmodulated energy from microwave oscillator 10 both pass through the gas cell 20.

The arrangement of Fig. 4 operates in a manner similar to that of Fig. 1. The unmodulated microwave energy in the neighborhood of $\omega_0$ is subject to the same high frequency sensitive phase shift as in Fig. 1. The side band energy, however, is well outside the width of the spectrum line at frequency $\omega_0$. Therefore, in passing through the gas of gas cell 20, substantially the only phase shift of the side band energy is that due to the physical travel. Substantially no phase shift due to gas resonance phenomena is impressed on the side band energy. Moreover, in the arrangement of Fig. 4 the side band energy and the unmodulated energy paths which are separate may be made shorter, and the common portion of their path to the detector 16 relatively longer. Therefore, the controlled frequency is better stabilized, and less susceptible to change due to ambient temperature shifts and the like which may differently influence the separate paths.

It will be apparent that there is disclosed herein a novel frequency control system, simple and inexpensive in construction, and relatively insensitive to frequency changes of the controlled frequency due to ambient temperature changes and the like.

What is claimed is:

1. A frequency control system comprising a microwave oscillator having a frequency control element for controlling the operating frequency, an amplitude modulation detector, means for modulating the microwave energy at a modulation frequency and suppressing the carrier frequency to derive at least one side band component of frequencies displaced from said operating frequency, said means being connected in a first signal path between said microwave oscillator and said detector, an element resonant at said operating frequency connected in a second signal path between said microwave oscillator and said detector and through which element unmodulated energy from the said microwave oscillator is applied to said detector in phase quadrature with respect to the phase of said suppressed carrier, said signal paths having distinct portions, a phase comparison detector connected to receive signals from said amplitude modulation detector and to receive signals from said modulating means to compare the phase of the said modulation frequency and the said amplitude modulation detector output, said phase comparison detector being connected to said oscillator to apply its output to said frequency control element.

2. The frequency control system claimed in claim 1, said signal paths having in common a portion including said resonant element.

3. The frequency control system claimed in claim 1, said element comprising a gas cell.

4. The frequency control system claimed in claim 3, said gas cell being connected in said second path in a portion distinct and different from the path in which said modulating means is connected.

5. The frequency control system claimed in claim 1, further comprising an adjustable phase shifter interposed in one of said two signal paths between said microwave oscillator and said amplitude modulation detector and not in the other.

6. The frequency control system claimed in claim 5, said phase shifter being interposed in said second signal path.

7. The frequency control system claimed in claim 1, said modulating means comprising a balanced modulator connected to receive microwave energy from said microwave oscillator, and a modulation oscillator connected to said modulator to provide a carrier suppressed balanced modulation output.

8. The frequency control system claimed in claim 1, further comprising a filter connected between said first detector and said phase comparison detector.

9. The frequency control system claimed in claim 1, further comprising a low pass filter connected between said phase comparison detector and said frequency control element.

10. A frequency control system comprising a microwave oscillator having a frequency control element, an amplitude modulation detector having an output, two signal paths connected between said amplitude modulation detector and said microwave oscillator, one only of said paths including means for modulating said microwave oscillator oscillations at a modulation frequency and suppressing the carrier frequency to provide at least one side band component displaced in frequency from the frequency of oscillations of said microwave oscillator, at least the other of said paths including an element resonant at said oscillator frequency, said amplitude modulation detector being connected to receive oscillations at said modulation frequency as a reference signal a quarter wave-length shifted at said detector with respect to a true amplitude modulation carrier for said side-band at said detector, and a phase detector connected to receive said amplitude modulation detector output and connected to receive modulation frequency signals from said modulating means and to compare the phase of said output with said modulation frequency signals, said phase comparison detector being connected to apply its output to said frequency control element.

11. The system claimed in claim 10, said modulating means comprising a balanced modulator and a modulation oscillator.

12. The system claimed in claim 11, said balanced modulator comprising a hollow pipe waveguide magic T arrangement.

13. The system claimed in claim 10, said signal paths having a portion in common, said portion including said element.

14. The system claimed in claim 10, said element being in said other path only and not in said one.

15. The system claimed in claim 10, said element comprising a gas cell.

16. The system claimed in claim 10, further comprising an adjustable phase shifter in one only of said paths.

17. The frequency control system claimed in claim 10, each said path comprising a waveguide section having a wall within which waves are guided, the said waveguides being physically connected in good thermal contact throughout the length of sections.

18. In a frequency control system having a microwave generator providing signals at a microwave frequency, the combination comprising means for modulating said microwave frequency signal from said generator to provide at least one side band signal, a resonant element connected to receive said microwave frequency signal and transmit said received signal with a phase shift dependent upon frequency shifts of said microwave frequency signal, and amplitude modulation detection means to combine said side band signal and said transmitted microwave signal including means to shift said transmitted microwave signal in phase a quarter wavelength electrically from the phase relationship of a true amplitude modulation carrier for said side band signal.

19. In a frequency control system, the combination claimed in claim 18, said resonant element comprising a gas cell.

20. A frequency control system for a microwave generator having a frequency control element including modulation means to modulate signals from said generator with a modulation signal for deriving at least one microwave frequency sideband with the microwave generator carrier frequency suppressed, a microwave resonant element responsive to signals from said generator for receiving said signals and transmitting said signals with phase shifts dependent upon frequency shifts of said microwave frequency signal, and means including means to shift said transmitted microwave signal in phase a quarter wavelength electrically from the phase relationship of a true amplitude modulation carrier for said side band signal for combining said microwave sideband signals, said frequency sensitive carrier signals, and modulation signals from said modulation means for providing a frequency control signal for said generator control element.

21. The system claimed in claim 20, said element comprising a gas cell.

22. A method of controlling the frequency of a microwave generator comprising the steps of modulating at a modulation frequency the signal from said generator to provide at least one side band component, applying the signal from said generator to a resonant element to provide a signal having a phase responsive to frequency shift of said generator signal, supplying the said frequency responsive signal to said side band component as a carrier phase shifted electrically a quarter wavelength from the phase relationship of a true amplitude modulation carrier and detecting the side band component and supplied carrier for amplitude modulation, comparing the phase of the signal so detected with the said modulation frequency, and controlling the generator frequency according to the detected phase relationship.

References Cited in the file of this patent

UNITED STATES PATENTS

| | | |
|---|---|---|
| 2,486,001 | Bruck et al. | Oct. 25, 1949 |
| 2,584,608 | Norton | Feb. 5, 1952 |